(12) United States Patent
Freeman et al.

(10) Patent No.: US 6,556,887 B2
(45) Date of Patent: Apr. 29, 2003

(54) METHOD FOR DETERMINING A POSITION OF A ROBOT

(75) Inventors: Marvin L. Freeman, Round Rock, TX (US); Jeffrey C. Hudgens, San Francisco, CA (US); Damon Keith Cox, Round Rock, TX (US); Chris Holt Pencis, Austin, TX (US); Michael Rice, Pleasanton, CA (US); David A. Van Gogh, Pasadena, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/905,091

(22) Filed: Jul. 12, 2001

(65) Prior Publication Data

US 2003/0014157 A1 Jan. 16, 2003

(51) Int. Cl.[7] ................................................. G06F 7/00
(52) U.S. Cl. ........................ 700/218; 700/229; 700/253; 700/258; 700/262; 414/936; 414/939; 414/816
(58) Field of Search ............................... 700/213, 218, 700/229, 245, 253, 258, 262; 414/935, 936, 937, 939, 800, 816; 901/48, 47

(56) References Cited

U.S. PATENT DOCUMENTS

| 4,819,167 A | * | 4/1989 | Cheng et al. ................. 700/59 |
| 4,944,650 A |   | 7/1990 | Matsumoto .................. 414/757 |
| 5,288,379 A | * | 2/1994 | Namiki et al. ......... 204/192.12 |
| 5,340,261 A |   | 8/1994 | Oosawa et al. ............. 414/217 |
| 5,363,872 A | * | 11/1994 | Lorimer ......................... 137/1 |
| 5,405,230 A |   | 4/1995 | Ono et al. ................... 414/217 |
| 5,483,138 A | * | 1/1996 | Shmookler et al. .... 318/568.16 |
| 5,796,486 A |   | 8/1998 | Jacob ........................... 356/375 |
| 5,934,856 A | * | 8/1999 | Asakawa et al. ............ 414/217 |
| 5,980,194 A | * | 11/1999 | Freerks et al. ............. 414/754 |
| 6,162,008 A |   | 12/2000 | Perkins et al. .............. 414/754 |
| 6,166,509 A |   | 12/2000 | Wyka et al. |
| 6,198,976 B1 | * | 3/2001 | Sundar et al. ................. 700/59 |
| 6,246,923 B1 | * | 6/2001 | Sugimura et al. ........... 700/218 |
| 6,313,596 B1 | * | 11/2001 | Wyka et al. ................. 318/640 |

FOREIGN PATENT DOCUMENTS

EP 0 878 267 A1 11/1998 ........... B23Q/15/18

OTHER PUBLICATIONS

International Search Report, dated Dec. 3, 2002 for PCT/US02/20647.

* cited by examiner

Primary Examiner—Khoi H. Tran
(74) Attorney, Agent, or Firm—Moser Patterson & Sheridan (57) ABSTRACT

Generally, a method of determining a position of a robot is provided. In one embodiment, a method of determining a position of a robot comprises acquiring a first set of positional metrics, acquiring a second set of positional metrics and resolving the position of the robot due to thermal expansion using the first set and the second set of positional metrics. Acquiring the first and second set of positional metrics may occur at the same location within a processing system, or may occur at different locations. For example, in another embodiment, the method may comprise acquiring a first set of positional metrics at a first location proximate a processing chamber and acquiring a second set of positional metrics in another location. In another embodiment, substrate center information is corrected using the determined position of the robot.

47 Claims, 4 Drawing Sheets

METHOD FOR DETERMINING A POSITION OF A ROBOT

BACKGROUND OF THE INVENTION

1. Field of the Invention

The embodiments of the invention generally relate to a method for determining a reference position of a robot utilized in a semiconductor processing system.

2. Background of the Related Art

Semiconductor substrate processing is typically performed by subjecting a substrate to a plurality of sequential processes to create devices, conductors and insulators on the substrate. These processes are generally performed in a process chamber configured to perform a single step of the production process. In order to efficiently complete the entire sequence of processing steps, a number of process chambers are typically coupled to a central transfer chamber that houses a robot to facilitate transfer of the substrate between the surrounding process chambers. A semiconductor processing platform having this configuration is generally known as a cluster tool, examples of which are the families of PRODUCER®, CENTURA® and ENDURA® processing platforms available from Applied Materials, Inc., of Santa Clara, Calif.

Generally, a cluster tool consists of a central transfer chamber having a robot disposed therein. The transfer chamber is generally surrounded by one or more process chambers. The process chambers are generally utilized to process the substrate, for example, performing various processing steps such as etching, physical vapor deposition, ion implantation, lithography and the like. The transfer chamber is sometimes coupled to a factory interface that houses a plurality of removable cassettes, substrate storage, each of which houses a plurality of substrates. To facilitate transfer between a vacuum environment of the transfer chamber and a generally ambient environment of the factory interface, a load lock chamber is disposed between the transfer chamber and the factory interface.

As line width and feature sizes of devices formed on the substrate have decreased, the positional accuracy of the substrate in the various chambers surrounding the transfer chamber has become paramount to ensure repetitive device fabrication with low defect rates. Moreover, with the increased amount of devices formed on substrates both due to increased device density and larger substrate diameters, the value of each substrate has greatly increased. Accordingly, damage to the substrate or yield loss due to non-conformity because of substrate misalignment is highly undesirable.

A number of strategies have been employed in order to increase the positional accuracy of substrates throughout the processing system. For example, the interfaces are often equipped with sensors that detect substrate misalignment within the substrate storage cassette. See U.S. patent application Ser. No. 09/562,252 filed May 2, 2000 by Chokshi, et al. Positional calibration of robots has become more sophisticated. See U.S. patent application Ser. No. 09/703,061 filed Oct. 30, 2000 by Chokshi, et al. Additionally, methods have been devised to compensate for substrate misplacement on the blade of the robot. See U.S. patent application Ser. No. 5,980,194, issued Nov. 9, 1999 to Freerks, et al., and U.S. Pat. No. 4,944,650, issued Jul. 31, 1990 to T. Matsumoto.

However, these methodologies for increasing the accuracy of the robot generally do not compensate for thermal expansion and contraction experienced by the robot as heat is transferred to the robot from hot wafers and from hot surfaces within the process chambers. As evolving process technology has led to higher operating temperatures for many processes, transfer robots are increasingly exposed to high temperatures. Due to the increase thermal exposure of transfer robots, the increase in robot linkage lengths and reach distances, it has become evident that robotic thermal expansion now substantially contributes to substrate misplacement.

For example, in a process chamber performing physical vapor deposition (PVD), the processing temperature may be as high as 200 degrees Celsius. Additionally, some chemical vapor deposition temperatures reach 400 degrees Celsius. Upon completion of the process within the chamber, a portion (generally the blade and a portion of the linkage) of the robot must enter the chamber and retrieve the hot substrate. While the substrate is held by the robot, thermal energy from the substrate and surrounding area is transferred to the robot linkages. This increase in thermal energy generally causes the linkages to expand, thus shifting the center reference position of the blade without providing feedback to the robot's controller. This causes the blade (and substrate) to be placed in a position different than anticipated by the controller. Cooling the robot linkages creates a similar problem by causing the linkages to shorten as they cool. Thus, the substrate may be mispositioned in another chamber by the robot during subsequent transfers due to the thermal shifting of the center reference position of the blade that may lead to substrate damage and defects in device fabrication.

Moreover, even systems equipped with center finding methods and devices may not account for error introduced by thermal changes to the robot. For example, one substrate center finding method rotates the substrate while a center-find sensor records points along the substrate edges. The substrate center relative to the rotation center is found. With the substrate center position known, the robot is sent to the wafer center position. This technique and others like it find offsets in wafer position but do not find errors in robot positioning. If the robot goes to a position different than an expected because of link length changes, the robot will not be correctly positioned during substrate transfer, which may result in substrate damage or defective processing.

The error may be even more dramatic in devices that perform center finding by collecting wafer edge data while the wafer is on the blade, especially with the robot in a retracted position. This is because the magnitude of the robot position error can be very different in the retracted compared to the extended position.

Additionally, the robot linkages may change length during movement between chambers due to thermal change or a long term affect where the robot temperature changes over many wafers. Thus, the substrate center data determined at one chamber is often not correct by the time the substrate reaches its destination such as a second chamber.

Therefore, there is a need for an improved method for determining a position of a robot.

SUMMARY OF THE INVENTION

Generally, a method of determining a position of a robot is provided. In one embodiment, a method of determining a position of a robot comprises acquiring a first set of positional metrics, acquiring a second set of positional metrics and resolving the position of the robot due to thermal expansion using the first set and the second set of positional metrics. Acquiring the first and second set of positional metrics may occur at the same location within a processing system, or may occur at different locations. For example, in another embodiment, the method may comprise acquiring a first set of positional metrics at a first location proximate a processing chamber and acquiring a second set of positional metrics in another location. In another embodiment, substrate center information is corrected using the determined position.

In another aspect of the invention, a robot having robot for transferring a substrate in a processing system is provided. In one embodiment, the robot includes a body coupled by a ceramic linkage to an end effector that is adapted to retain the substrate thereon. In another embodiment, the linkage further comprises titanium-doped alumina.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
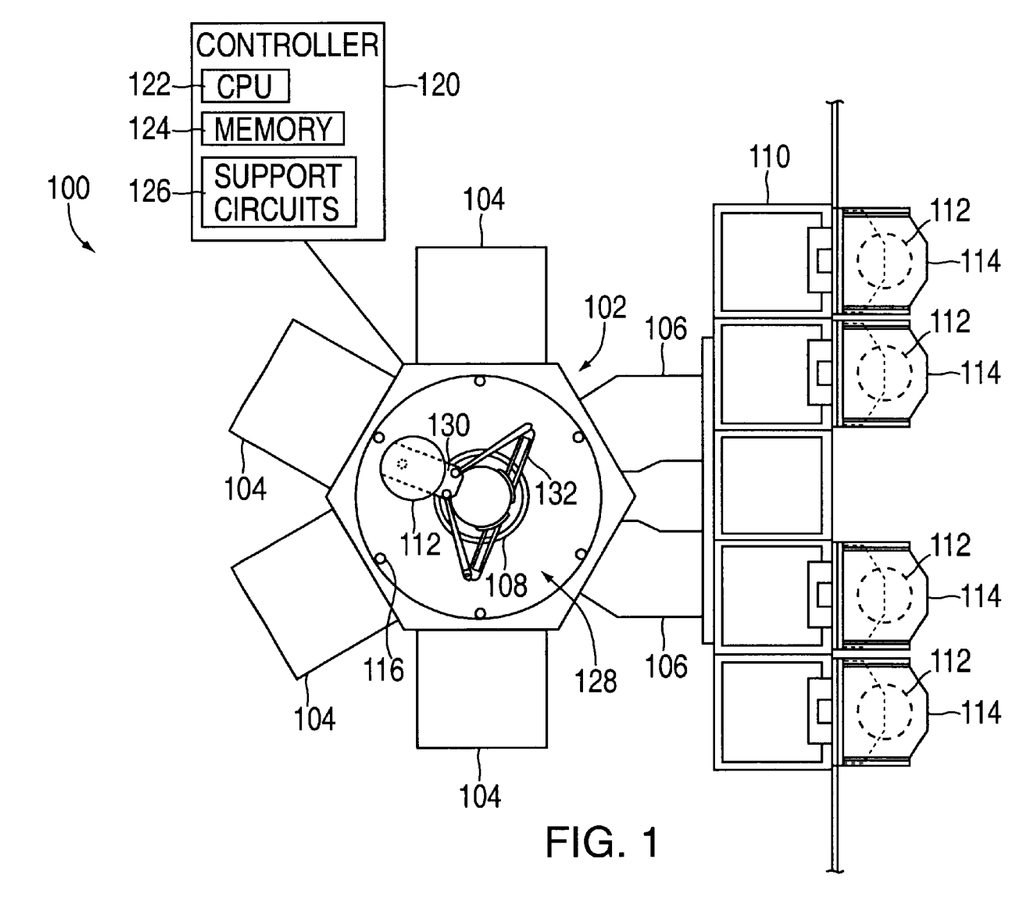
FIG. 1 is a plan view of one embodiment of a semiconductor processing system in which a method for determining a position of a robot may be practiced.

FIG. 1 depicts one embodiment of a semiconductor processing system 100 wherein a method for determining a position of a robot 108 may be practiced. The exemplary processing system 100 generally includes a transfer chamber 102 circumscribed by one or more process chambers 104, a factory interface 110 and one or more load lock chambers 106. The load lock chambers 106 are generally disposed between the transfer chamber 102 and the factory interface 110 to facilitate substrate transfer between a vacuum environment maintained in the transfer chamber 102 and a substantially ambient environment maintained in the factory interface 110. One example of a processing system which may be adapted to benefit from the invention is a CENTURA® processing platform available from Applied Materials, Inc., of Santa Clara, Calif. Although the method for determining the position of a robot is described with reference to the exemplary processing system 100, the description is one of illustration and accordingly, the method may be practiced wherever the determination or position of a robot is desired in applications where the robot or the robot's components are exposed to changes in temperature or the reference position of the substrate transferred by the robot is desired.

The factory interface 110 generally houses one or more substrate storage cassettes 114. Each cassette 114 is configured to store a plurality of substrates therein. The factory interface 110 is generally maintained at or near atmospheric pressure. In one embodiment, filtered air is supplied to the factory interface 110 to minimize the concentration of particles within the factory interface and correspondingly substrate cleanliness. One example of a factory interface that may be adapted to benefit from the invention is described in U.S. patent application Ser. No. 09/161,970 filed Sep. 28, 1998 by Kroeker, which is hereby incorporated by reference in its entirety.

The transfer chamber 102 is generally fabricated from a single piece of material such as aluminum. The transfer chamber 102 defines an evacuable interior volume 128 through which substrates are transferred between the process chambers 104 coupled to the exterior of the transfer chamber 102. A pumping system (not shown) is coupled to the transfer chamber 102 through a port disposed on the chamber floor to maintain vacuum within the transfer chamber 102. In one embodiment, the pumping system includes a roughing pump coupled in tandem to a turbomolecular or a cryogenic pump.

The process chambers 104 are typically bolted to the exterior of the transfer chamber 102. Examples of process chambers 104 that may be utilized include etch chambers, physical vapor deposition chambers, chemical vapor deposition chambers, ion implantation chambers, orientation chambers, lithography chambers and the like. Different process chambers 104 may be coupled to the transfer chamber 102 to provide a processing sequence necessary to form a predefined structure or feature upon the substrate surface.

The load lock chambers 106 are generally coupled between the factory interface 110 and the transfer chamber 102. The load lock chambers 106 are generally used to facilitate transfer of the substrates between the vacuum environment of the transfer chamber 102 and the substantially ambient environment of the factory interface 110 without loss of vacuum within the transfer chamber 102. Each load lock chamber 106 is selectively isolated from the transfer chamber 106 and the factory interface 110 through the use of a slit valve 226 (see FIG. 2).

The substrate transfer robot 108 is generally disposed in the interior volume 128 of the transfer chamber 102 to facilitate transfer of the substrates 112 between the various chambers circumscribing the transfer chamber 102. The robot 108 may include one or more blades utilized to support the substrate during transfer. The robot 108 may have two blades, each coupled to an independently controllable motor (known as a dual blade robot) or have two blades coupled to the robot 108 through a common linkage.

In one embodiment, the transfer robot 108 has a single blade 130 coupled to the robot 108 by a (frog-leg) linkage 132. Generally, one or more sensors 116 are disposed proximate each of the processing chambers 104 to trigger data acquisition of the robot's operational parameters or metrics utilized in determining the position of the robot. The data may be used separately or in concert with the robot parameters to determine the reference position of a substrate 112 retained on the blade 138.

Generally, a bank of sensors 116 are disposed on or in the transfer chamber 102 proximate the passages coupling the transfer chamber 102 to the load lock 106 and process chambers 104. The sensor bank 116 may comprise one or more sensors that are utilized to trigger data acquisition of robot metrics and/or substrate positional information.

To facilitate control of the system 100 as described above, a controller 120 is coupled to the system 100. The controller 120 generally includes a CPU 122, memory 124 and support circuits 126. The CPU 122 may be one of any form of computer processor that can be used in industrial settings for controlling various chambers and subprocessors. The memory 124 is coupled to the CPU 122. The memory 124, or computer-readable medium, may be one or more of readily-available memory such as random access memory (RAM) read-only memory (ROM), floppy disk, hard drive, device buffer or any other form of digital storage, local or remote. The support circuits 126 are coupled to the CPU 122 for supporting the processor in a conventional manner. These circuits 126 may include cache, power supplies, clock circuits, input-output circuitry, subsystems and the like.

Figure 2:
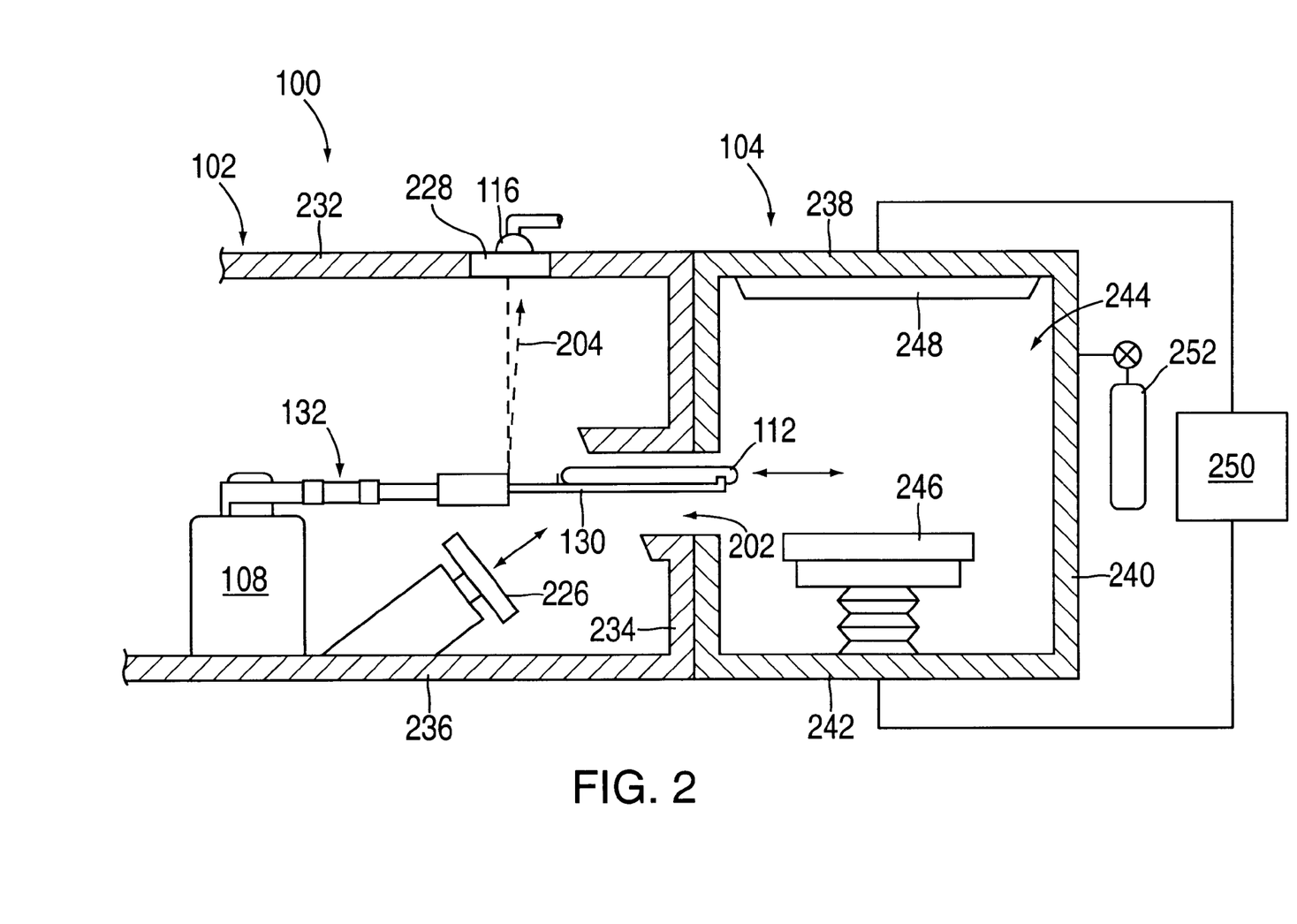
FIG. 2 is a partial sectional view of the processing system of FIG. 1.

FIG. 2 depicts a partial sectional view of the system 100 illustrating the transfer chamber 102 and one of the process chambers 104 coupled thereto. Although the illustrative substrate transfer is described between the process chamber 104 and the transfer chamber 102, the method of transfer described below finds utility in transfer with the load lock chamber 106, other chambers or within the transfer chamber itself wherever information regarding thermal change in the length of the robot linkage 130 is desired.

The illustrative transfer chamber 104 generally includes a bottom 242, sidewalls 240 and lid 238 that enclose a process volume 244. In one embodiment, the process chamber 104 may be a PVD chamber. A pedestal 246 is disposed in the process volume 244 and generally supports the substrate 112 during processing. A target 248 is coupled to the lid 238 and is biased by a power source 250. A gas supply 252 is coupled to the process chamber 104 and supplies process and other gases to the process volume 244. The supply 252 provides a process gas such as argon from which a plasma is formed. Ions from the plasma collide against the target 248, removing material that is then deposited on the substrate 112. PVD and other process chambers which may benefit from the invention are available from Applied Materials, Inc., of Santa Clara, California.

Generally, the transfer chamber 102 has a bottom 236, sidewalls 234 and lid 232. The transfer robot 108 is generally disposed on the bottom 236 of the transfer chamber 102. One sidewall 236 of the transfer chamber 102 generally includes a port 202 through which the substrate may be passed by the transfer robot 108 to the interior of the process chamber 104. The port 202 is selectively sealed by a slit valve 226 to isolate the transfer chamber 102 from the process chamber 104. The slit valve 226 is generally moved to an open position as shown in FIG. 2 to allow transfer of the substrate between the chambers. One slit valve which may be used to advantage is described in U.S. Pat. No. 5,226,623 issued Jul. 13, 1993 to Tepman et al., and is hereby incorporated by reference in its entirety.

The lid 232 of the transfer chamber 102 generally includes a window 228 disposed proximate the port 202. The sensor 116 is generally disposed on or near the window 228 so that the sensor 116 may view a portion of the robot 108 and the substrate 112 as the substrate passes through the port 202. The window 228 may be fabricated of quartz or other material that does not substantially interfere with the detection mechanism of the sensor 116, for example, a beam of light emitted and reflected back to the sensor 116 through the window 228. In another embodiment, the sensor 116 may emit a beam through the window 228 to a second sensor positioned on the exterior side of a second window disposed in the bottom 236 of the chamber 102 (second sensor and second window not shown).

The sensor 116 is generally disposed on the exterior of the window 228 so that the sensor 116 is isolated from the environment of the transfer chamber 102. Alternatively, other positions of the sensor 116 may be utilized including those within the chamber 102 as long as the sensor 116 may be periodically tripped by motion of the robot 108 or substrate 112 therethrough. The sensor 116 is coupled to the controller 120 and is configured to record one or more robot or substrate metrics at each chance in sensor state. The sensor 116 may include a separate emitting and receiving unit or may be self-contained such as "thru-beam" and "reflective" sensors. The sensor 116 may be an optical sensor, a proximity sensor, mechanical limit switch, Hall-effect, reed switches or other type of detection mechanism suitable for detecting the presence of the robot 108 or the substrate.

In one embodiment, the sensor 116 comprises an optical emitter and receiver disposed on the exterior of the transfer chamber. One sensor suitable for use is available from Banner Engineering Corporation, located in Minneapolis, Minn. The sensor 116 is positioned such that the robot 108 or substrate 112 interrupts a signal from the sensor, such as a beam 204 of light. The interruption and return to an uninterrupted state of the beam 204 causes a change in state of the sensor 116. For example, the sensor 116 may have a 4 to 20 ma output, where the sensor 116 outputs a 4 ma in the uninterrupted state while the sensor outputs 20 ma in the interrupted state. Sensors with other outputs may be utilized to signal the change in sensor state.

Figure 3:
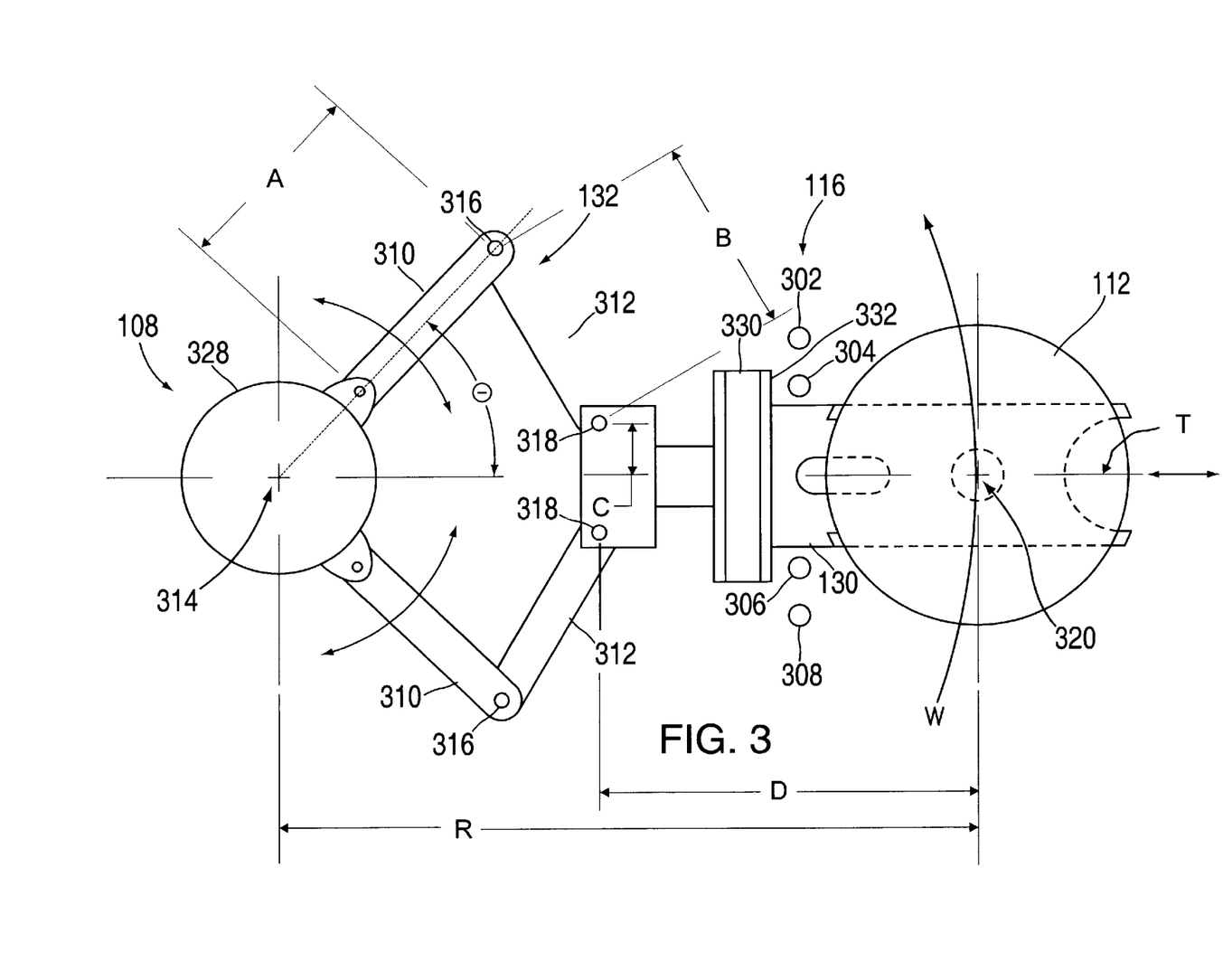
FIG. 3 is a plan view of one embodiment of a semiconductor transfer robot.

FIG. 3 depicts a plan view of one embodiment of the transfer robot 108. The transfer robot 108 generally comprises a robot body 328 that is coupled by the linkage 132 to the blade 130 that supports the substrate 112. In one embodiment, the linkage 132 has a frog-leg configuration. Other configurations for the linkage 132, for example, a polar configuration may be alternatively utilized. The linkage 132 generally includes two wings 310 coupled at an elbow 316 to two arms 312. Each wing 310 is additionally coupled to an electric motor (not shown) concentrically stacked within the robot body 328. Each arm 312 is coupled by a bushing 318 to a wrist 330. The wrist 330 couples the linkage 132 to the blade 130. Typically, the linkage 132 is fabricated from aluminum, however, materials having sufficient strength and smaller coefficients of thermal expansion, for example, titanium, stainless steel or a ceramic such as titanium-doped alumina, may also be utilized.

At ambient temperatures, each wing 310 has a length "A", each arm 312 has a length "B", half the distance between the bushings 318 on the wrist 330 has a length "C" and a distance "D" is defined between the bushing 318 and a blade center point 320 of the blade 130. A reach "R" of the robot is defined as a distance between the center point 320 of the blade 130 and a center 314 of the robot along a line "T". Each wing 310 makes an angle θ with the line T.

Each wing 310 is independently controlled by one of the concentrically stacked motors. When the motors rotate in the same direction, the blade 130 is rotated at an angle ω about the center 314 of the robot body 328 at a constant radius. When both of the motors are rotated in opposite directions, the linkage 132 accordingly expands or contracts, thus moving the blade 130 radially inward or outward along T in reference to the center 314 of the robot 108. Of course, the robot 108 is capable of a hybrid motion resulting from combining the radially and rotational motions simultaneously.

As the substrate 112 is moved by the transfer robot 108, the sensor 116 detects the substrate or a portion of the robot upon reaching a predetermined position, for example, a position proximate the port 202.

In one embodiment, the sensor 116 comprises a bank of sensors, for example four sensors, that may be tripped by different portions of the substrate and/or robot to capture a plurality of data sets during a single pass of the robot 108. For example, an edge 332 of the wrist 330 of the robot 108 passing through the beam 304 causes the change of state of a first sensor 302 and a second sensor 304 while the substrate causes the change of state of the first sensor 302, the second sensor 304, a third sensor 306 and a fourth sensor 308. Although the invention is described as having the wrist 330 or substrate 112 activate the sensors 302, 304, 306 and 308, the sensors may be activated by other components of the robot 108.

Figure 4:
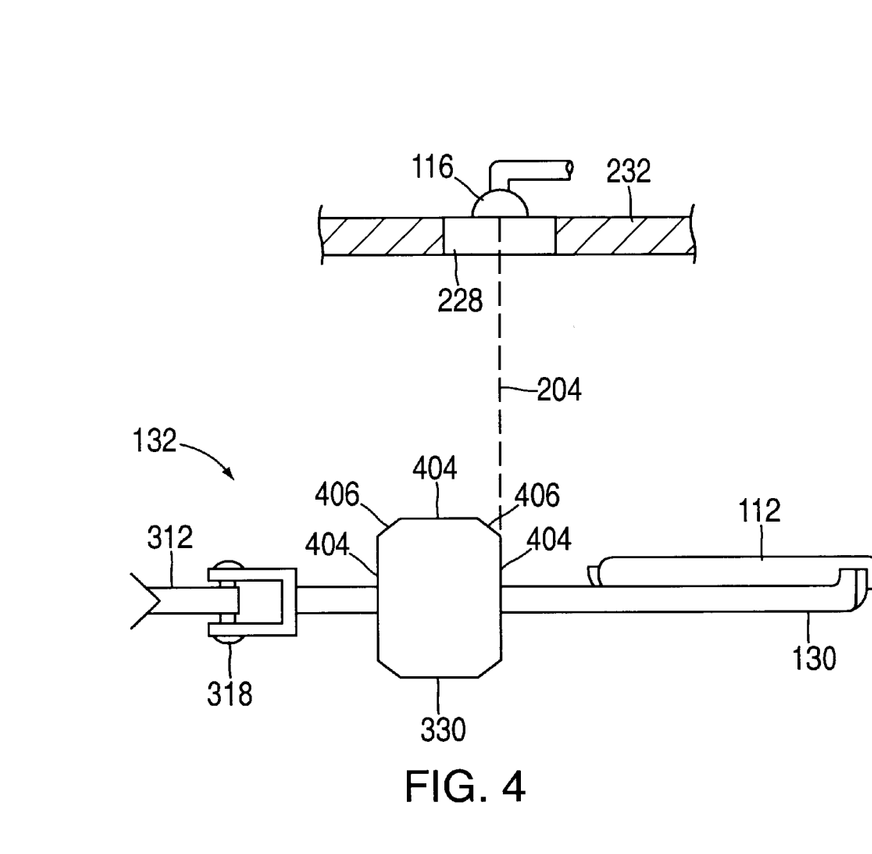
FIG. 4 depicts one embodiment of a wrist of the robot of FIG. 3.

FIG. 4 depicts one embodiment of the wrist 330 of the robot. The wrist 330 of the robot is configured to have a flat upper surface 402 and sides 404 that are generally disposed at right angles to one another. The interface between the sides 404 and upper surface 402 generally has a sharp edge or chamfer 406 to reduce the amount of light scattering by the beam 202 of the sensor 116. The sharp edge or chamfered transition 406 between the upper surface 402 and the sides 404 provides a crisp change in sensor state which enhances the accuracy of the data acquisition described below.

Returning to FIG. 3, as the wrist 330 passes through one or more of the sensors 116, the sensors are changed from a block state to an unblock state or vice versa. The change of the sensor state generally corresponds to the robot 108 (or substrate 112) being in a predetermined position relative to the sensor 116. Each time the robot 108 passes through any one of these predetermined positions, the robot metrics at the time of the event are recorded in the memory 124 of the controller 120. The robot metrics recorded at each event generally includes the sensor number, the sensor state (either blocked or unblocked), the current position of each of the two robot motors, the velocity of the two robot motors and a time stamp. Utilizing the robot metrics recorded at two events, the controller 120 can resolve the change in an actual position $R_a$ of the robot 108 versus an expected position Re due to any expansion or contraction of the robot linkages 132 due to thermal changes. The controller 120 utilizes the thermal expansion data to resolve the position of the blade 130 (or other reference point of the robot) at other extensions of the robot 108.

Optionally, the sensors 116 may be utilized to acquire positional data of the substrate 112 to determine the center position of the substrate. The substrate center information may be used along or in concert with the blade position information.

The method for determining the position of the robot is generally stored in the memory 124, typically as software and software routine. Software routine may also be stored and/or executed by a second CPU (not shown) that is remotely located from the system or being controlled by the CPU.

Figure 5:
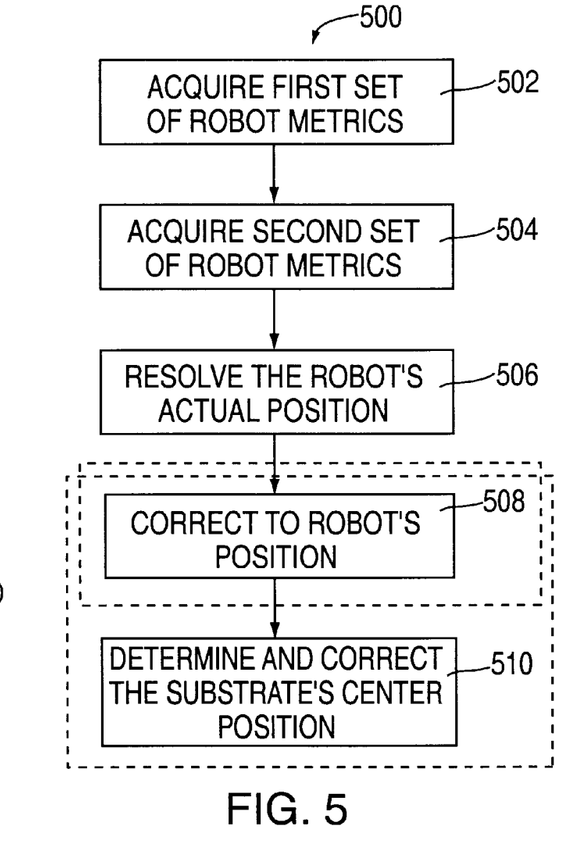
FIG. 5 is a block diagram of one embodiment of a method for determining a position of a robot.

FIG. 5 depicts a block diagram of one embodiment of a method 500 for determining the position of the robot. The method 500 begins at step 502 by acquiring a first set of robot metrics. Generally, the first set of robot metrics are recorded in response to a change in state (i.e., tripping) of one of the sensors 116 as the wrist 330 of the robot 108 passes the sensor 116 while delivering the substrate 112 into one of the process chambers 104. Alternatively, the sensor 116 may be tripped as the substrate 112 is retrieved from the process chamber 104 or other location.

At step 504, the second set of robot metrics is acquired. Generally, the second set of robot metrics are recorded in response to tripping one of the sensors 116 as the wrist 330 passes one of the sensors 116. Typically, the sensor 116 tripped in step 504 is the same sensor that was tripped as the substrate 112 was delivered into the process (or other) chamber 104 in step 502. Alternatively, different sensors may be tripped in steps 502 and 504.

At step 506, the actual position of the robot due to thermal expansion of the robot is resolved using the first and second robot metrics. In one embodiment, the thermal expansion of the robot may be resolved by determining a change in the distance R between a distance $R_e$ expected by the controller for a particular θ and the $R_a$ as the wrist 330 passes the sensor 116. From this information, θ' may be calculated in step 508 as the angle needed to place the robot's blade 130 at $R_e$. Optionally, a step 510 may be included to determine and correct a center position of the substrate 112 disposed on the blade 330.

For example, as the robot extends, θ becomes smaller. The reach R may be expressed as:

$$R(\theta) = A\cos\theta + \sqrt{B^2 - (A\sin\theta - C)^2} + D$$

If the robot linkage 132 (i.e., the wing, arm and wrist) are all made of the same material, the expansion ratios will be the ratios of the temperature rise in the related linkage elements. If the robot linkage 132 is made of different material, the ratios need to be scaled by the thermal expansion coefficient for each of the materials of the respective linkage element. In either case, $E_{AB}$ and $E_{BC}$ are approximately constants dependent on the materials of the linkage 132. From the constants $E_{AB}$ and $E_{AC}$, the relative growth of each element can be expressed as:

$$\frac{dA}{dB} = \frac{A}{B} E_{AB}$$

$$\frac{dC}{dB} = \frac{C}{B} \frac{1}{E_{BC}}$$

At each sensor transition the robot position θ is latched. For each wrist transition, the change in the reach R can be expressed as:

$$dR = (\text{SensorPosition} + \text{BladeCenterToWristEdge}) - R(\theta)$$

The change in extension per change in robot element is:

$$\frac{\partial R}{\partial A} = \frac{-\sin\theta(A\sin\theta - C)}{\sqrt{B^2 - (A\sin\theta - C)^2}} + \cos\theta$$

$$\frac{\partial R}{\partial B} = \frac{B}{\sqrt{B^2 - (A\sin\theta - C)^2}}$$

$$\frac{\partial R}{\partial C} = \frac{A\sin\theta - C}{\sqrt{B^2 - (A\sin\theta - C)^2}}$$

For each event, dB is calculated:

$$dB = \frac{dR}{\left(\frac{dA}{dB}\frac{\partial R}{\partial A} + \frac{\partial R}{\partial B} + \frac{dC}{dB}\frac{\partial R}{\partial C}\right)}$$

This value is averaged if multiple sensors are used to capture the robot metrics during a single pass of the robot through the sensor bank. dA and dC are calculated from it:

$$dA = \frac{dA}{dB}dB$$

$$dC = \frac{dC}{dB}dB$$

Thus, the actual position of the robot at any θ may be expressed as:

$$R_a = R'(\theta) = A' \cos\theta + \sqrt{B'^2 - (A'\sin\theta - C')^2} + D$$

where $$A' = A + dA$$

$$B' = B + dB$$

$$C' = C + dC$$

Thus, the correction of θ to place the blade 130 to $R_e$ may be expressed as:

$$\theta' = \arctan\left(\frac{C'}{R_{CH} - D}\right) + \arccos\left(\frac{B'^2 - A'^2 - ((C'^2 + (R-D)^2))}{\sqrt{C'^2 + (R-D)^2 - 2A'}}\right)$$

where $R_{CH}$ is R at ambient conditions; and

θ' is the robot rotation that makes $R(\theta') = R_e$.

The center of the substrate 112 may additionally be calculated from the robot metrics recorded as the substrate's edges trigger the sensors 116 as the substrate passes the sensor bank. The data points from the perimeter of the substrate 112 are used to triangulate a center position of the substrate.

In one embodiment, the centerfind algorithm is performed by converting each latched substrate edge position to an X,Y co-ordinate system, where 0,0 is at the center of the blade 130, and Y extends out away from the robot center. Next, the list of points (from the latched edge position) are examined and points that are significantly not co-circular with the other points are removed from consideration. Dropped points may be due, for example, points being latched as a notch or flat present in some substrates 112 passes one of the sensors 116. Each of the remaining points are grouped into combinations of 3 points to define both a triangle and a circle. If the area of the triangle is very small, that combination of points will be very error sensitive for circle calculation, and is excluded from further consideration. Next, the center and radius is calculated for the circle defined by each remaining combination of 3 points. The X and Y coordinates for the centers of all such circles with a radius within an acceptable range are then averaged to get the X and Y center offset of the substrate. To correct for this X and Y offset, dx=−x and dy=−y must be applied to the robot to center the substrate.

The substrate exchange point in the chamber is calibrated with a robot rotation and extension that positions the robot blade 130 properly into the chamber at ambient temperature. The extension corresponds to $R_{CH}$, which is the reach into the process (or other) chamber 104. By adding the dY value, we can calculate the amount to reach into the chamber to correct for the substrate offset:

$$R = R_{CH} + dY$$

The extension angle is then calculated (angle between wing and chamber position) to reach this extension, based on the thermal expansion of the linkage 132 of the robot 108:

$$\omega = \arctan\left(\frac{C'}{R-D}\right) + \arccos\left(\frac{B'^2 - A'^2 - ((C'^2 + (R-D)^2))}{\sqrt{C'^2 + (R-D)^2 - 2A'}}\right)$$

The robot rotation is also corrected based on dX.

The method may also include correcting the center position of the substrate using center find information stored in the controller's memory 124. The center position of the substrate may be found through various methods. One method includes gripping the substrate on the blade of the robot along a number of points along the substrate's perimeter to mechanically center the substrate on the blade. Another method includes passing the substrate linearly through one or more sensors that determine the edge, position of the substrate relative the blade. Yet another method includes rotating the substrate proximate a sensor that views the perimeter of the substrate. By recording a number of points along the substrate's perimeter, the substrate's center may be triangulated.

Once the center of the substrate is determined and stored in memory, the substrate center position may be up-dated relative the change in position due to thermal effects. Moreover, the center position may be up-dated iteratively as the robot transfers the substrate chamber to chamber and the position of robot is re-determined as the robot (or substrate) passes each sensor. Accordingly, the thermal effects on the position of the robot is determined for each the substrate transfer, thus allowing the controller to adjust the position of the substrate for each transfer ensuring accurate, damage free, substrate placement.

Although the process of the present invention is discussed as being implemented as the software routine, some of the method steps disclosed herein may be performed in hardware as well as by itself or controller. As such, the invention may be implemented in software as executed upon a computer system in hardware as in applications, specific integrated circuit or other type of hardware implementation or a combination of software and hardware.

While the foregoing is directed to the preferred embodiment of the present invention, other and further embodiments of the invention may be devised without departing from the basic scope thereof, and the scope thereof is determined by the claims that follow.

What is claimed is:

1. A method of determining a position of a robot, the method comprising:

acquiring a first set of robot metrics;

acquiring a second set of robot metrics; and resolving the position of the robot due to thermal expansion of the robot using the first set and second set of robot metrics.

2. The method of claim 1, wherein the step of acquiring the first set of metrics further comprises:

causing at least a first sensor to change states.

3. The method of claim 2, wherein the step of causing at the first sensor to change states further comprises:

passing a portion of a robot or a substrate disposed on the robot proximate the first sensor.

4. The method of claim 1, wherein the step of acquiring the first set of metrics further comprises:

causing a plurality of sensors to change states.

5. The method of claim 4, wherein the step of causing the plurality sensor to change states further comprises:

passing a portion of a robot proximate the first sensor; and passing a substrate disposed on proximate the first sensor.

6. The method of claim 1, wherein data representing said determined first set of metrics is stored in a memory.

7. The method of claim 6, wherein said memory comprises at least one of a buffer memory and a controller memory.

8. The method of claim 1, wherein the step of acquiring the first set of metrics further comprises:
   causing at least a first sensor disposed proximate a first aperture in a chamber to change states; and
   wherein the step of acquiring the second set of metrics further comprises:
      causing at least the first sensor disposed proximate the first aperture to change states.

9. The method of claim 1, wherein the step of acquiring the first set of metrics further comprises:
   causing at least a first sensor disposed proximate a first aperture in a chamber to change states; and
   wherein the step of acquiring the second set of metrics further comprises:
      causing at least a second first sensor disposed proximate a second aperture in the chamber to change states.

10. The method of claim 2, wherein the first sensor is a detection mechanism selected from the group of sensors consisting of optical sensors, proximity sensors, limit switches, reed switches and Hall-effect switches.

11. The method of claim 2, wherein the step of causing the first sensor to change states further comprises:
   interrupting a beam of light emitted from the first sensor.

12. The method of claim 11, wherein the step of interrupting the beam further comprise passing the beam through a window disposed in a chamber.
   acquiring a second set of robot metrics; and
   resolving a correction of the position of the robot due to thermal expansion of the robot using the first set and second set of robot metrics.

13. The method of claim 1, wherein the first set of metrics further comprises one or more data attributes selected from the group consisting of a sensor identification, a time of data collection, position of a first robot motor, position of a second robot motor, velocity of the first robot motor, velocity of the second robot motor, and a state of the sensor.

14. The method of claim 1, wherein the step of resolving the position of the robot due further comprises:
   determining a change in length of a linkage extending between the robot and a substrate support blade.

15. The method of claim 14, wherein the step of determining the change in length of the linkage further comprises:
   determining an actual reach $R_a$ of the robot;
   wherein the linkage comprising a frog-legged linkage having a pair of wings extending from a central body of the robot, the wings coupled by a respective arm to a wrist, each arm coupled to the wrist by a bushing, and the wrist coupled to the substrate support blade; and
   wherein $R_a$ is described by:

$$R_a = R'(\theta) = A' \cos\theta + \sqrt{B'^2 - (A'\sin\theta - C')^2} + D$$

where $A'$ is the expanded length of a wing linkage; $\theta$ is the angular position of the wing linkage, $B'$ is the expanded length of an arm linkage which is coupled to the wing, $C'$ is half the expanded distance between a bushings on a wrist and $D'$ is the length of the blade defined from the blade center point to the wrist bushing.

16. The method of claim 1 further comprising:
   correcting a stored reference point using the determined reference point.

17. The method of claim 16, wherein the correcting step further comprises rotating a first motor and a second motor coupled to a frog-leg linkage in opposite directions through an angle $\theta$, wherein $\theta$ is described by:

$$\theta' = \arctan\left(\frac{C'}{R_{CH} - D}\right) + \arccos\left(\frac{B'^2 - A'^2 - ((C'^2 + (R-D)^2))}{\sqrt{C'^2 + (R-D)^2 - 2A'}}\right)$$

where $R_{CH}$ is the reach at ambient conditions $A' = A + dA$ $B' = B + dB$ $C' = C + dC$.

18. The method of claim 16 further comprising:
   acquiring a third set of robot metrics;
   resolving a new position of the robot due to thermal expansion of the robot using the second set and the third set of robot metrics; and
   updating the stored reference point using the new position.

19. The method of claim 1 further comprising:
   acquiring a third set of robot metrics;
   resolving the position of the robot due to thermal expansion of the robot using the second set and the third set of robot metrics; and
   correcting a stored reference point using the determined reference point.

20. The method of claim 1 further comprising:
   determining a center position of a substrate disposed on the robot.

21. The method of claim 20 further comprising:
   correcting the determined center position by the determined position.

22. The method of claim 1, wherein the robot includes at least one linkage fabricated from ceramic.

23. The method of claim 1, wherein the robot includes at least one linkage fabricated from titanium-doped alumina.

24. A method of determining a position of a robot in a semiconductor processing system having a plurality of ports through which a substrate is passed, at least one process chamber coupled to one of the ports, the method comprising:
   determining a center position of the substrate;
   adjusting the position by the relative position of the center position;
   acquiring a first set of positional metrics;
   acquiring a second set of positional metrics;
   resolving a change position of the robot due to thermal expansion of the robot using the first set and second set of positional metrics; and
   adjusting the position by the resolved change in position.

25. The method of claim 24, wherein the step of acquiring the first set of metrics further comprises:
   causing at least a first sensor disposed proximate a first aperture in a chamber to change states; and
   wherein the step of acquiring the second set of metrics further comprises:
      causing at least the first sensor disposed proximate the first aperture to change states.

26. The method of claim 24, wherein the step of acquiring the first set of metrics further comprises:
  causing at least a first sensor disposed proximate a first aperture in a chamber to change states; and
  wherein the step of acquiring the second set of metrics further comprises:
    causing at least a second first sensor disposed proximate a second aperture in the chamber to change states.

27. A computer-readable medium having stored thereon a plurality of instructions, the plurality of instructions including instructions which, when executed by a processor, determines a change in position of a robot in a semiconductor processing system comprising:
  acquiring a first set of positional metrics;
  acquiring a second set of positional metrics; and
  resolving a correction of the position of the robot due to thermal expansion of the robot using the first set and second set of positional metrics.

28. The computer-readable media of claim 27, wherein the step of acquiring the first set of metrics further comprises:
  causing at least a first sensor to change states.

29. The computer-readable media of claim 28, wherein the step of causing at the first sensor to change states further comprises:
  passing a portion of a robot or a substrate disposed on the robot proximate the first sensor.

30. The computer-readable media of claim 27, wherein the step of acquiring the first set of metrics further comprises:
  causing at plurality of sensors to change states.

31. The computer-readable media of claim 30, wherein the step of causing at the plurality sensor to change states further comprises:
  passing a portion of a robot proximate the first sensor; and
  passing a substrate disposed on proximate the first sensor.

32. The computer-readable media of claim 27, wherein data representing said determined first set of metrics is stored in a memory.

33. The computer-readable media of claim 32, wherein said memory comprises at least one of a buffer memory and a controller memory.

34. The computer-readable media of claim 27, wherein the step of acquiring the first set of metrics further comprises:
  causing at least a first sensor disposed proximate a first aperture in a chamber to change states; and
  wherein the step of acquiring the second set of metrics further comprises:
    causing at least the first sensor disposed proximate the first aperture to change states.

35. The computer-readable media of claim 27, wherein the step of acquiring the first set of metrics further comprises:
  causing at least a first sensor disposed proximate a first aperture in a chamber to change states; and
  wherein the step of acquiring the second set of metrics further comprises:
    causing at least a second first sensor disposed proximate a second aperture in the chamber to change states.

36. The computer-readable media of claim 28, wherein the first sensor is a detection mechanism selected from the group of sensors consisting of optical sensors, proximity sensors, limit switches, reed switches and Hall-effect switches.

37. The computer-readable media of claim 28, wherein the step of causing the first sensor to change states further comprises:
  sending a beam from the first sensor; and
  reflecting the beam to the first sensor.

38. The computer-readable media of claim 37, wherein the steps of sending and receiving the beam further comprise passing the beam through a window disposed in a chamber.

39. The computer-readable media of claim 27, wherein the first set of metrics further comprises on or more data attributes selected from the group consisting of a sensor identification, a time of data collection, position of a first robot motor, position of a second robot motor, velocity of the first robot motor, velocity of the second robot motor, and a state of the sensor.

40. The computer-readable media of claim 27, wherein the step of resolving the position of the robot due further comprises:
  determining a change in length of a linkage extending between the robot and a substrate support blade.

41. The computer-readable media of claim 40, wherein the step of determining the change in length of the linkage further comprises:
  determining an actual reach $R_a$ of the robot;
  wherein the linkage comprising a frog-legged linkage having a pair of wings extending from a central body of the robot, the wings coupled by a respective arm to a wrist, each arm coupled to the wrist by a bushing, and the wrist coupled to the substrate support blade; and
  wherein $R_a$ is described by:

$$R_a = R'(\theta) = A' \cos\theta + \sqrt{B'^2 - (A'\sin\theta - C')^2} + D$$

where A' is the expanded length of a wing linkage; θ is the angular position of the wing linkage, B' is the expanded length of an arm linkage which is coupled to the wing, C' is half the expanded distance between a bushings on a wrist and D' is the length of the blade defined from the blade center point to the wrist bushing.

42. The computer-readable media of claim 27 further comprising:
  correcting a stored reference point using the determined reference point.

43. The computer-readable media of claim 42, wherein the correcting step further comprises rotating a first motor and a second motor coupled to a frog-leg linkage in opposite directions through an angle θ, wherein θ is described by:

$$\theta' = \arctan\left(\frac{C'}{R_{CH} - D}\right) + \arccos\left(\frac{B'^2 - A'^2 - ((C'^2 + (R-D)^2))}{\sqrt{C'^2 + (R-D)^2} - 2A'}\right)$$

where $R_{CH}$ is the reach at ambient conditions $A' = A + dA$ $B' = B + dB$ $C' = C + dC$.

44. The computer-readable media of claim 42 further comprising:
  acquiring a third set of robot metrics;
  resolving a new position of the robot due to thermal expansion of the robot using the second set and the third set of robot metrics; and updating the stored reference point using the new position.

45. The computer-readable media of claim 27 further comprising:

acquiring a third set of robot metrics;

resolving the position of the robot due to thermal expansion of the robot using the second set and the third set of robot metrics; and correcting a stored reference point using the determined reference point.

46. The computer-readable media of claim 27 further comprising:

determining a center position of a substrate disposed on the robot.

47. The computer-readable media of claim 42 further comprising:

correcting the determined center position by the determined position.

* * * * *

UNITED STATES PATENT AND TRADEMARK OFFICE
CERTIFICATE OF CORRECTION

PATENT NO. : 6,556,887 B2
APPLICATION NO. : 09/905091
DATED : April 29, 2003
INVENTOR(S) : L. Freeman et al.

It is certified that error appears in the above-identified patent and that said Letters Patent is hereby corrected as shown below:

Column 7, Line 41: Change "Re" to -- $R_e$ --

Column 8, Line 23: Change $\sqrt{B^{2-(a\sin\theta-C)^2}}$ to $\sqrt{B^2-(a\sin\theta-C)^2}$ Column 8, Line 60: Change $dB = \dfrac{dR}{\left\{\dfrac{dA}{dB}\dfrac{\partial R}{\partial A}+\dfrac{\partial R}{\partial B}+\dfrac{dC}{dB}\dfrac{\partial R}{\partial C}\right\}}$ to $dB = \dfrac{dR}{\left\{\dfrac{dA}{dB}\dfrac{\partial R}{\partial A}+\dfrac{\partial R}{\partial B}+\dfrac{dC}{dB}\dfrac{\partial R}{\partial C}\right\}}$ Column 9, Line 10: Change $\sqrt{B'^{2-(A'\sin\theta-C')^2}}$ to $\sqrt{B'^2-(A'\sin\theta-C')^2}$ Column 10, Line 15: Remove the comma after "edge"
Column 11, Claim 12, Line 31: Change "comprise" to --comprises--
Column 11, Claim 12, Line 32: Replace the period after "chamber" with a semicolon Column 11, Claim 15, Line 60: Change $\sqrt{B'^{2-(A'\sin\theta-C')^2}}$ to $\sqrt{B'^2-(A'\sin\theta-C')^2}$

Column 14, Claim 39, Line 10: After "comprises," change "on" to --one--

Column 14, Claim 41, Line 33: Change $\sqrt{B'^{2-(A'\sin\theta-C')^2}}$ to $\sqrt{B'^2-(A'\sin\theta-C')^2}$ Signed and Sealed this Twenty-first Day of November, 2006

JON W. DUDAS
*Director of the United States Patent and Trademark Office*